(12) United States Patent
Kerdiles et al.

(10) Patent No.: US 9,799,549 B2
(45) Date of Patent: Oct. 24, 2017

(54) PROCESS FOR MANUFACTURING A COMPOSITE STRUCTURE

(71) Applicant: Soitec, Crolles (FR)

(72) Inventors: Sebastien Kerdiles, Saint Ismier (FR); Guillaume Chabanne, Froges (FR); Francois Boedt, Meylan (FR); Aurelia Pierret, Crolles (FR); Xavier Schneider, Le Versoud (FR); Didier Landru, Champ Pres Froges (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 14/780,467

(22) PCT Filed: Mar. 21, 2014

(86) PCT No.: PCT/FR2014/050666
§ 371 (c)(1),
(2) Date: Sep. 25, 2015

(87) PCT Pub. No.: WO2014/154978
PCT Pub. Date: Oct. 2, 2014

(65) Prior Publication Data
US 2016/0042989 A1 Feb. 11, 2016

(30) Foreign Application Priority Data
Mar. 29, 2013 (FR) .................. 13 00738

(51) Int. Cl.
*H01L 21/762* (2006.01)
*H01L 21/02* (2006.01)
(Continued)

(52) U.S. Cl.
CPC .... *H01L 21/76254* (2013.01); *H01L 21/0217* (2013.01); *H01L 21/02164* (2013.01); *H01L 27/12* (2013.01); *H01L 29/0649* (2013.01)

(58) Field of Classification Search
CPC ......... H01L 21/76254; H01L 21/76259; H01L 23/49822; H01L 23/49833; H01L 23/49827; H01L 23/49877; H01L 23/49894; H01L 23/14–23/15
See application file for complete search history.

(56) References Cited

U.S. PATENT DOCUMENTS 6,939,783 B2 * 9/2005 Neyret .............. H01L 21/76251
257/347
7,518,187 B2 * 4/2009 Sakurada .............. C30B 15/203
117/43
(Continued)

FOREIGN PATENT DOCUMENTS

CN 101419943 A 4/2009
EP 1780794 A1 5/2007
(Continued)

OTHER PUBLICATIONS

International Search Report for International Application No. PCT/FR2014/0500666 dated May 19, 2014, 2 pages.
(Continued)

*Primary Examiner* — Jose R Diaz
(74) *Attorney, Agent, or Firm* — TraskBritt

(57) ABSTRACT

The disclosure relates to a process for manufacturing a composite structure, the process comprising the following steps: a) providing a donor substrate and a carrier substrate; b) forming a dielectric layer; c) forming a covering layer; d) forming a weakened zone in the donor substrate; e) joining the carrier substrate and the donor substrate via a contact surface having an outline; f) fracturing the donor substrate via the weakened zone, steps b) and e) being executed so that the outline is inscribed in the outline, and step c) being executed so that the covering layer covers the peripheral surface of the dielectric layer.

12 Claims, 6 Drawing Sheets

(51) Int. Cl.
*H01L 27/12* (2006.01)
*H01L 29/06* (2006.01)

(56) References Cited

U.S. PATENT DOCUMENTS

| | | | | |
|---|---|---|---|---|
| 7,601,613 | B2* | 10/2009 | Mitani | H01L 21/26506 |
| | | | | 438/455 |
| 7,781,309 | B2* | 8/2010 | Morita | H01L 21/2007 |
| | | | | 438/455 |
| 7,829,431 | B2* | 11/2010 | Tanaka | H01L 21/3145 |
| | | | | 257/E21.001 |
| 7,875,532 | B2* | 1/2011 | Kakehata | H01L 21/76254 |
| | | | | 257/E21.122 |
| 8,110,478 | B2* | 2/2012 | Yamazaki | H01L 21/76254 |
| | | | | 257/E21.523 |
| 2006/0128078 | A1 | 6/2006 | Moriwaki et al. | |
| 2008/0308897 | A1 | 12/2008 | Kakehata et al. | |
| 2012/0001293 | A1 | 1/2012 | Ben Mohamed et al. | |

FOREIGN PATENT DOCUMENTS

| | | | | |
|---|---|---|---|---|
| FR | 2852143 | A1 | 9/2004 | |
| FR | 2852143 | B1 * | 10/2005 | ....... H01L 21/76251 |
| JP | 2003224247 | | 8/2003 | |
| JP | EP 1780794 | A1 * | 5/2007 | ....... H01L 21/26506 |
| JP | 2008294425 | | 12/2008 | |
| JP | 2009021567 | | 1/2009 | |
| WO | 2012059350 | A2 | 5/2012 | |

OTHER PUBLICATIONS

International Preliminary Report on Patentability for International Application No. PCT/FR2014/0500666 dated Sep. 29, 2015, 7 pages.
International Written Opinion for International Application No. PCT/FR2014/0500666 dated Sep. 29, 2015, 6 pages.
Chinese First Office Action for Chinese Application No. 2014800187529 dated Mar. 7, 2017, 6 pages.
Japanese Office Action for Japanese Application No. 2016-504722 dated Aug. 22, 2017, 5 pages.

* cited by examiner

PROCESS FOR MANUFACTURING A COMPOSITE STRUCTURE

CROSS-REFERENCE TO RELATED APPLICATIONS

This application is a national phase entry under 35 U.S.C. §371 of International Patent Application PCT/FR2014/050666, filed Mar. 21, 2014, designating the United States of America and published as International Patent Publication WO 2014/154978 A1 on Oct. 2, 2014, which claims the benefit under Article 8 of the Patent Cooperation Treaty and under 35 U.S.C. §119(e) to French Patent Application Serial No. 1300738, filed Mar. 29, 2013, the disclosure of each of which is hereby incorporated herein in its entirety by this reference.

TECHNICAL FIELD

This disclosure relates to a method for manufacturing a composite structure. The disclosure also relates to a composite structure.

BACKGROUND

A method, illustrated in FIG. 1, for manufacturing a composite structure comprising, from its rear face to its front face, a supporting substrate 1, a covering layer 2, at least one dielectric layer 3 and a useful layer 4, and known from the prior art (see, for example, the document EP 1780794), comprises the following steps:
a) providing a donor substrate 5 and the supporting substrate 1;
b) forming at least the dielectric layer 3 comprising:
   a first surface in contact with the donor substrate 5,
   a second surface opposite to the first surface,
   a peripheral surface connecting the first and second surfaces together;
the dielectric layer 3 has a contour Cz;
c) forming the covering layer 2 arranged so as to cover the second surface of the dielectric layer 3;
d) forming a weakened zone 6 in the donor substrate 5 delimiting the useful layer 4 in contact with the first surface of the dielectric layer 3;
e) assembling the supporting substrate 1 and the donor substrate 5, so that the supporting substrate 1 and the covering layer 2 are in contact along a contact surface 7 having a contour Cs;
f) breaking the donor substrate 5 along the weakened zone 6.

Hereinafter, the assembly formed by the useful layer 4, the dielectric layer 3 and the covering layer 2 will be designated by the term stack of layers 8.

At the end of step f), the stack of layers 8 is transferred onto the supporting substrate 1 in order to form the composite structure.

As illustrated in FIG. 2, the composite structure has a peripheral ring 9.

This peripheral ring 9 is situated in a peripheral zone of the supporting substrate 1 and, in which, in the absence of sufficient adhesion between the supporting substrate 1 and the donor substrate 5, the transfer of the stack of layers 8 does not take place.

Thus, a step is observed at the limit separating the peripheral ring 9 from the stack of transferred layers 8.

Moreover, the flanks of the covering layer 2 and dielectric layer 3 are exposed at the step and, therefore, not protected from any chemical attacks.

Consequently, the chemical attack may generate particles via delamination of the useful layer 4.

When only the dielectric layer 3 or the covering layer 2 is formed, for example, the dielectric layer 3, this step is also observed. A creep of the useful layer 4 is generally executed so as to cover or encapsulate the dielectric layer 3 at the step.

However, the applicant has found that, when there is a covering layer 2 and at least one dielectric layer 3, the step of breaking at the edge of the substrate is atypical. FIG. 3 thus shows the steps obtained on such a substrate after the breaking step f).

When there are several intermediate layers present, the breaking step does not lead to a single step but, on the contrary, to several steps. It appears in fact that the break propagates at the periphery of the substrate, not along the weakened zone but at the interface between the dielectric layer 3 and the covering layer 2.

The main drawback of this manufacturing method is, therefore, that it leads to an atypical break at the edge of the substrate.

This is, in particular, the case when the composite structure comprises, from its rear face toward its front face, a silicon substrate, a silicon dioxide layer, a silicon nitride layer, a silicon dioxide layer and a silicon layer.

Moreover, the presence of several steps makes it impossible for the creep to take place by heat treatment of the useful layer 4 so as to protect the covering layer 2 and the dielectric layer 3 at the step.

This is because, during heat treatment, dewetting of the useful layer 4 rather than creep is observed.

One aim of the disclosure is, therefore, to propose a method for manufacturing a composite substrate that makes it possible to execute a step of creep of the useful layer 4 so as to cover the exposed surface of the covering layer 2 and of the dielectric layer 3 at the step.

BRIEF SUMMARY

This disclosure aims to remedy the aforementioned drawbacks and relates to a method for manufacturing a composite structure comprising, from its rear face toward its front face, a supporting substrate, a covering layer, at least one dielectric layer and a useful layer, the method comprising the following steps:
a) providing a donor substrate and the supporting substrate;
b) forming at least the dielectric layer comprising:
   a first surface in contact with the donor substrate,
   a second surface opposite to the first surface,
   a peripheral surface connecting the first and second surfaces together;
the dielectric layer has a contour;
c) forming the covering layer arranged so as to cover the second surface of the dielectric layer;
d) forming a weakened zone in the donor substrate delimiting the useful layer in contact with the first surface of the dielectric layer;
e) assembling the supporting substrate and the donor substrate, so that the supporting substrate and the covering layer are in contact along a contact surface having a contour;

f) breaking the donor substrate along the weakened zone;

the method being remarkable in that steps b) and e) are performed so that the contour of the dielectric layer fits within the contour of the contact surface, and step c) is executed so that the covering layer covers the peripheral surface of the dielectric layer.

Thus, after the transfer step f), the stack of layers is transferred onto the supporting substrate.

The stack of transferred layers comprises a central portion and a peripheral portion.

The central portion of the stack comprises the useful layer, the dielectric layer and the covering layer.

The peripheral portion comprises only the useful layer and the covering layer.

It is then observed that a simple step is obtained. The peripheral portion corresponds to the transfer of a stack comprising a single intermediate layer.

Thus, the fracture step leads to a single step at the peripheral ring.

Consequently, the composite structure obtained allows creep of a useful layer, by executing a heat treatment, for example, so as to encapsulate the covering layer, in particular, at the single step.

According to one embodiment, the supporting substrate comprises:
  a top surface onto which the covering layer, the dielectric layer and the useful layer are transferred;
  a bottom surface opposite to the top surface;
  a peripheral zone connecting the bottom surface and the top surface;
  the contour of the contact surface and the peripheral zone of the supporting substrate delimit an essentially annular surface of width $L_1$, and steps b) and e) are executed so that the contour of the dielectric layer and the peripheral zone of the supporting substrate delimit an essentially annular surface with a width $L_2$ of between 105% and 150%, preferably between 110% and 140%, even more preferentially between 115% and 130%, of the width $L_1$.

According to one embodiment, the dielectric layer is formed in two steps, b1) and b2):
  b1) deposition of a layer of dielectric material on the donor substrate;
  b2) partial removal of the layer of dielectric material so that the residual layer of dielectric material forms the dielectric layer.

According to one embodiment, the dielectric layer comprises silicon nitride, and has a thickness of between 10 nm and 80 nm.

According to one embodiment, the covering layer comprises silicon dioxide, and has a thickness greater than 80 nm.

According to one embodiment, the donor substrate comprises at least one of the following materials: silicon, germanium, and silicon germanium alloy.

According to one embodiment, step f) is followed by a heat treatment step intended to encapsulate the covering layer and the dielectric layer with the useful layer.

According to one embodiment, the donor substrate comprises an additional layer, the additional layer being in contact with the dielectric layer, the additional layer having the same chemical composition as the covering layer.

According to one embodiment, the donor substrate comprises silicon, the additional layer comprises silicon dioxide, the dielectric layer comprises silicon nitride and the covering layer comprises silicon dioxide.

The disclosure also relates to a composite structure comprising, from its rear face to its front face, a supporting substrate, a covering layer, at least one dielectric layer and a useful layer, the dielectric layer having:
  a first surface in contact with the useful layer;
  a second surface in contact with the covering layer;
  a peripheral surface connecting the first surface and the second surface, the composite structure being remarkable in that the covering layer covers in its entirety the peripheral surface of the dielectric layer, so that the useful layer and the covering layer encapsulate the dielectric layer.

The transferred stack of layers comprises a central portion and a peripheral portion.

The central portion of the stack comprises the useful layer, the dielectric layer and the covering layer.

The peripheral portion comprises only the useful layer and the covering layer.

Thus, a simple step is observed and the peripheral portion corresponds to a stack comprising a single intermediate layer.

Consequently, the composite structure obtained allows creep of the useful layer, by execution of a heat treatment, for example, so as to encapsulate the covering layer at the single step.

According to one embodiment, the useful layer comprises at least one of the following materials: silicon, germanium, and silicon germanium alloy.

According to one embodiment, the useful layer comprises a monocrystalline material.

According to one embodiment, the covering layer comprises silicon dioxide.

According to one embodiment, the dielectric layer comprises silicon nitride.

According to one embodiment, the covering layer has:
  a first surface in contact with the supporting substrate,
  a second surface in contact with the dielectric layer,
  a peripheral surface connecting the first and second surfaces of the covering layer,
  the useful layer covering the peripheral surface of the covering layer.

According to one embodiment, the additional layer is interposed between the useful layer and the dielectric layer, the additional layer having the same chemical composition as the covering layer.

According to one embodiment, the useful layer comprises monocrystalline silicon, the additional layer comprises thermal silicon dioxide, the dielectric layer comprises silicon nitride, and the covering layer comprises silicon dioxide.

BRIEF DESCRIPTION OF THE DRAWINGS

Other features and advantages will emerge from the following description of embodiments of a manufacturing method according to the disclosure, given by way of non-limitative examples with reference to the accompanying drawings, in which.

DETAILED DESCRIPTION

For the various embodiments, the same references will be used for identical elements or ones fulfilling the same function, for reasons of simplification of the description.

Figure 1:
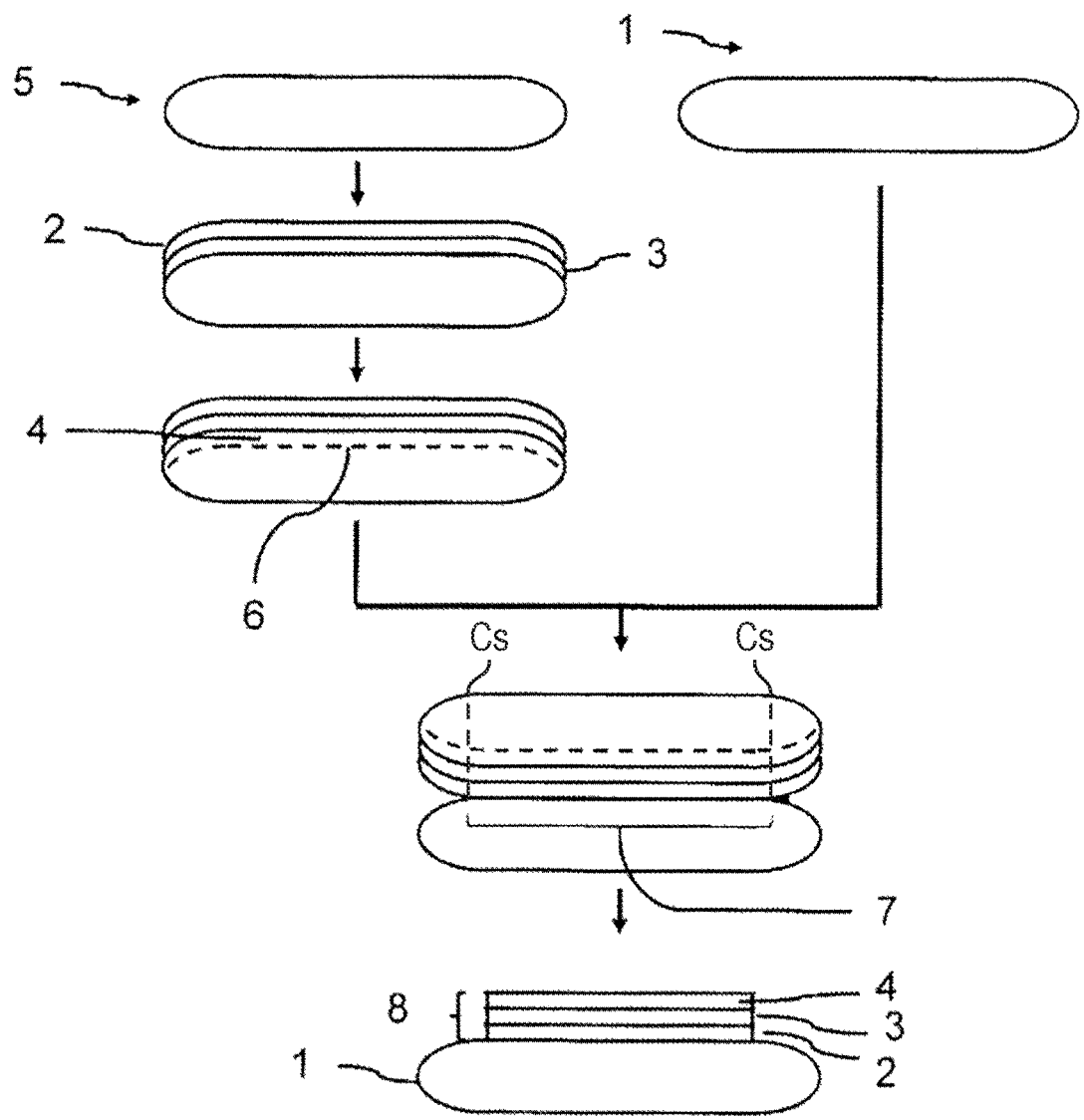
FIG. 1 is a schematic representation of a manufacturing method according to the techniques known from the prior art.
Figure 2:
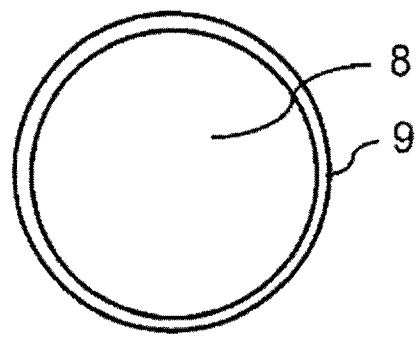
FIG. 2 is a view of the front face of a composite structure obtained by a manufacturing method according to the known techniques of the prior art.
Figure 3:
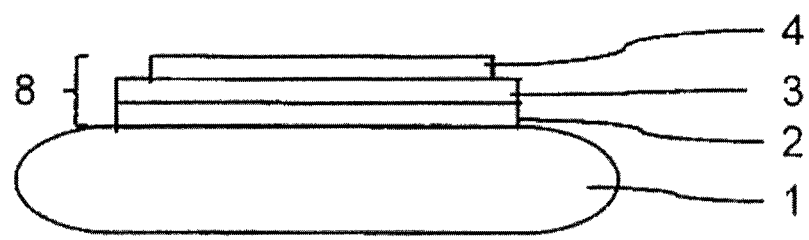
FIG. 3 is a view in cross section of a substrate used in the manufacturing method according to the known techniques of the prior art.
Figure 4A:
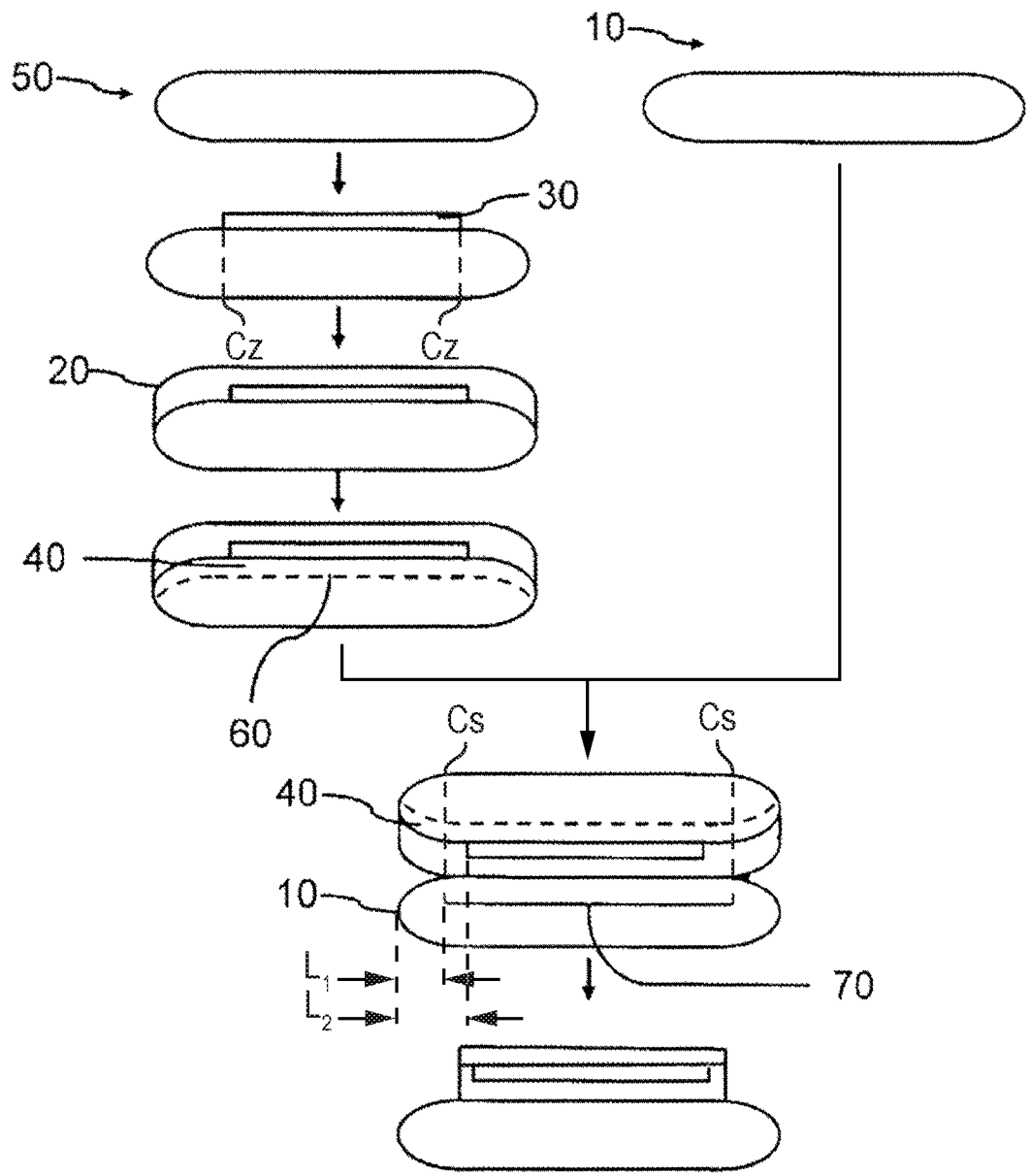
FIGS. 4A and 4B are schematic representations of a first embodiment of the disclosure.
Figure 4B:
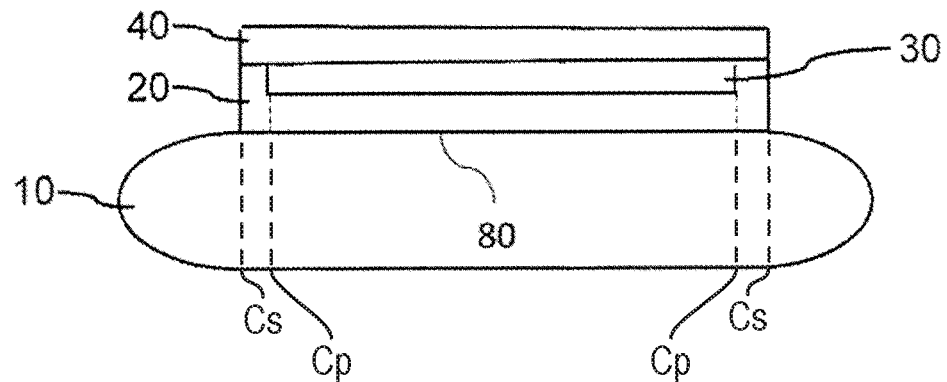

The method illustrated in FIGS. 4A and 4B is a method for manufacturing a composite structure comprising, from its rear face to its front face, a supporting substrate 10, a covering layer 20, at least one dielectric layer 30 and a useful layer 40, the method comprising the following steps:

a) providing a donor substrate 50 and the supporting substrate 10;

b) forming at least the dielectric layer 30 comprising:
  a first surface in contact with the donor substrate,
  a second surface opposite to the first surface,
  a peripheral surface connecting the first and second surfaces together;
the dielectric layer 30 has a contour Cz;

c) forming the covering layer 20 arranged to cover the second surface of the dielectric layer 30;

d) forming a weakened zone 60 in the donor substrate 50 delimiting the useful layer 40 in contact with the first surface of the dielectric layer 30;

e) assembling the supporting substrate 10 and the donor substrate 50, so that the supporting substrate 10 and the covering layer 20 are in contact along a contact surface 70 having a contour Cs;

f) breaking the donor substrate 50 along the weakened zone 60.

Steps b) and e) are executed so that the contour Cz of the dielectric layer 30 fits within the contour Cs of the contact surface 70, and step c) is executed so that the covering layer 20 covers the peripheral surface of the dielectric layer 30.

Prior to the implementation of the manufacturing method according to the disclosure, a step for determining the contour Cs of the contact surface can be executed.

This determination step is particularly advantageous when it is a question of implementing the method for manufacturing a plurality of composite structures.

This is because, in the context of the manufacture of a plurality of composite structures, a plurality of donor substrates 50 and a plurality of supporting substrates 10 are chosen so that the contour Cs of the contact surface is substantially equivalent (or even identical) from one composite structure to another.

The donor substrates 50 in the plurality of donor substrates 50 are then chosen so as to have substantially equivalent or even equal geometric characteristics.

The supporting substrates 10 of the plurality of supporting substrates 10 are then chosen so as to have substantially equivalent or even equal geometric characteristics.

Geometric characteristics of a substrate means, non-limitatively, its thickness at any point on its surface, its variation in thickness and its shape.

Thus, it suffices to determine the contour Cs for manufacturing a structure and to apply the result to the manufacture of a plurality of composite structures.

The determination of the contour Cs may comprise the following steps:
  assembling a supporting substrate 10 and a donor substrate 50;
  use of a scanning acoustic microscope in order to obtain an image of the contour Cs of the contact surface 70.

Another solution would be, in implementing the method for manufacturing a composite structure, to omit the formation of the dielectric layer 30 and to measure, at all points on the edge of the supporting substrate, the width of the peripheral ring.

The appearance of the peripheral ring on the composite structure is delimited by the edge of the supporting substrate and the contour Cs of the contact surface 70. Determination of the contour Cs is then direct.

For example, the applicant has found that the manufacture of a composite structure comprising a covering layer 20 leads to the formation of a peripheral ring with a width of 0.8 mm.

Particularly advantageously, the supporting substrate 10 comprises:
  a top surface onto which the covering layer 20, the dielectric layer 30 and the useful layer 40 are transferred;
  a bottom surface opposite to the top surface;
  a peripheral zone connecting the bottom surface and the top surface;
  the contour Cs of the contact surface 70 and the peripheral zone of the supporting substrate 10 delimiting an essentially annular surface of width $L_1$, and steps b) and e) are executed so that the contour Cz of the dielectric layer 30 and the peripheral zone of the supporting substrate 10 delimit an essentially annular surface with a width $L_2$ of between 105% and 150%, preferably between 110% and 140%, even more preferentially between 115% and 130%, of the width $L_1$.

Thus, in the context of a method for manufacturing a plurality of composite structures, the plurality of donor substrates 50 and the plurality of supporting substrates 10 may have a certain dispersion of their geometrical characteristics.

The donor substrate 10 provided at step a) may comprise one of the materials chosen from: silicon, silicon germanium, and germanium.

The supporting substrate 30 provided at step a) may consist of any of the materials normally used in the microelectronic, optical, optoelectronic and photovoltaic industries.

In particular, the supporting substrate 10 comprises at least one material selected from the following group of materials: silicon, silicon carbide, silicon germanium, glass, a ceramic and a metal alloy.

At least one dielectric layer 30 is formed on the donor substrate.

A covering layer 20 is formed so as to cover the dielectric layer 30.

The formation of the covering layer 20 and of the dielectric layer 30 will be detailed below during the description of various embodiments.

Next, a step d) of forming a weakened zone 60 in the donor substrate 50 is executed.

The weakened zone 60 delimits, in the donor substrate 50, a useful layer 40, the useful layer being in contact with the dielectric layer 30.

The useful layer 40 is intended to be transferred onto the supporting substrate 10.

The weakened zone 60 may be created by the implantation of atomic species in the donor substrate 50.

Atomic species means atomic, molecular or ionic species.

The species introduced may comprise at least one of the following species: hydrogen and helium.

The hydrogen may be introduced with an energy of between 10 and 210 keV and a dose of between $7 \times 10^{15}$ and $1 \times 10^{17}$ at/cm$^2$.

The assembly step e) may be a molecular bonding step.

The breaking step f) may advantageously be a thermal annealing executed at a temperature of between 300° C. and 600° C.

At the end of step f), the composite structure is obtained.

The composite structure comprises, from its front face to its rear face, the useful layer 40, the dielectric layer 30, the covering layer 20 and the supporting substrate 10.

First Embodiment

The first embodiment is illustrated in FIGS. 4A and 4B.

Formation of the Dielectric Layer 30

The dielectric layer 30 may be formed in two steps:
b1) formation of a layer of dielectric material of the donor substrate 10;
b2) partial removal of the layer of dielectric material so that the residual layer of dielectric material forms the dielectric layer 20.

Step b1) may be a technique of vapor deposition, low-pressure vapor deposition or plasma-assisted vapor deposition on the donor substrate 50. It may also be a heat treatment technique in a chosen atmosphere (nitriding, oxidation, etc.).

The thickness of the layer of dielectric material may be between 10 nm and 80 nm, for example, 50 nm.

Step b1) is then followed by a step b2), which comprises a partial removal of the layer of dielectric material. The partial removal is executed so that the remaining or residual portion of the layer of dielectric material constitutes the dielectric layer 30.

In other words, the partial removal of the layer of dielectric material is executed on a peripheral surface of the donor substrate 50 delimited by the edge of the donor substrate 50 and the contour Cz.

Thus, the residual portion of the layer of dielectric material forms the dielectric layer 30.

The peripheral surface of the donor substrate 50 may have the form of an annular surface.

Step b2) may advantageously be executed by a chemical etching solution.

Particularly advantageously, a plurality of dielectric layers 30 may be formed successively. For example, one dielectric layer 30 comprising silicon nitride and another dielectric layer 30 comprising silicon dioxide may be formed successively.

In the case of a dielectric layer 30 comprising silicon nitride ($Si_3N_4$), the chemical etching solution may be a solution of phosphoric acid ($H_3PO_4$) heated to a temperature greater than 50° C.

The chemical etching solution may be distributed by a nozzle on the edge of the donor substrate 50 in rotation, so as to etch the dielectric layer 30 only on the peripheral surface of the donor substrate 50 delimited by the edge of the donor substrate 10 and the contour Cz.

Formation of the Covering Layer 20

The covering layer 20 may be formed by a vapor deposition, low-pressure vapor deposition or plasma-assisted vapor deposition technique.

The covering layer covers the second surface and the peripheral surface of the dielectric layer 30 in their entirety.

The covering layer 20 may comprise a material, different from the materials of the dielectric layer 30, selected from the following materials: silicon oxide, silicon nitride or oxynitride, aluminium nitride, aluminium oxide, polycrystalline silicon and amorphous silicon.

Particularly advantageously, the covering layer 20 comprises silicon oxide and its thickness is greater than 80 nm, for example, 100 nm.

At the end of step f), the composite structure is obtained.

The composite structure comprises, from its rear face to its front face, a supporting substrate 10, a covering layer 20, at least one dielectric layer 30 and a useful layer 40, the dielectric layer 30 having:
a first surface in contact with the useful layer 40;
a second surface in contact with the covering layer 20;
a peripheral surface connecting the first surface and the second surface, the covering layer 20 covers in its entirety the peripheral surface of the dielectric layer 30, so that the useful layer 40 and the covering layer 20 encapsulate the dielectric layer 30.

Thus, after the transfer step, the dielectric layer 30 of contour Cz is situated vertically in line with a central surface 80, of contour Cp, of the supporting substrate 10.

Thus, the surface delimited by the contour Cs of the contact surface 70 and the contour Cp of the central surface 80 is opposite a stack of layers comprising only the useful layer 40 and the covering layer 20.

Moreover, the central surface 80 of the supporting substrate 10 is facing a stack of layers comprising the useful layer 40, the dielectric layer 30 and the covering layer 20.

Thus, a single step is observed at the edge of the substrate.

Figure 5:
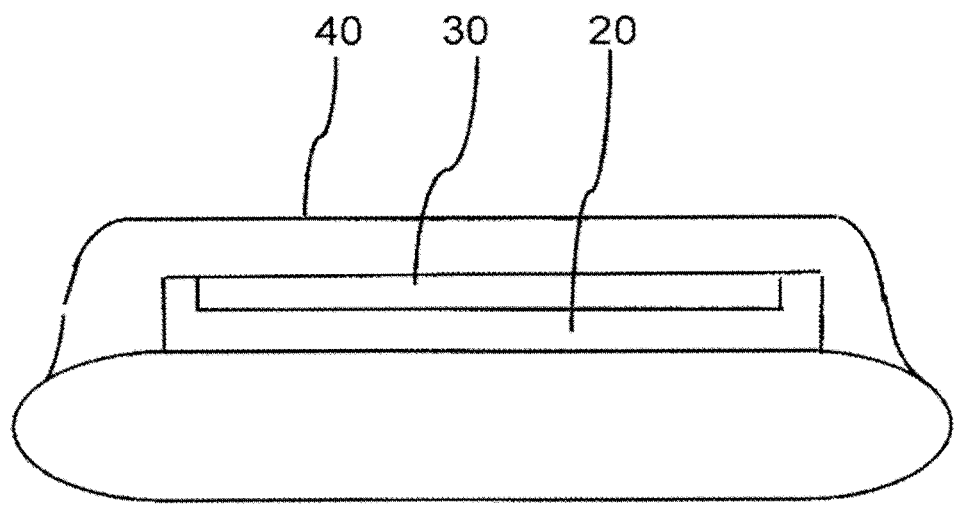
FIG. 5 is a view in transverse section of a composite structure that has been obtained by a manufacturing method according to the disclosure and has undergone an encapsulation treatment.

Consequently, the observation of a single step makes it possible to encapsulate the covering layer 20 and the dielectric layer 30 with the useful layer 40. The encapsulation is executed by a heat treatment, without observing any dewetting of the useful layer 40 as illustrated in FIG. 5.

In this regard, a person skilled in the art will find a technical description of encapsulation of an insulation layer by the useful layer 40 in the published application FR 2852143 A1 (E. NEYRET) 11 Sep. 2005 (Nov. 10, 2005) page 10 lines 3-28.

In a particular configuration of this first embodiment, the covering layer 20 is made from polycrystalline silicon or amorphous silicon, and its thickness is between a few nm and a few thousand nm, such as, for example, 2000 nm. The dielectric layer 30 is made from silicon oxide, and the useful layer 40 is made from silicon. Thus, a composite silicon-on-insulator structure having a buried layer of polycrystalline silicon or amorphous silicon under the insulating layer is formed. This type of composite structure is particularly suitable for manufacturing semiconductor devices finding applications in the radio-frequency field.

Second Embodiment

Figure 6A:
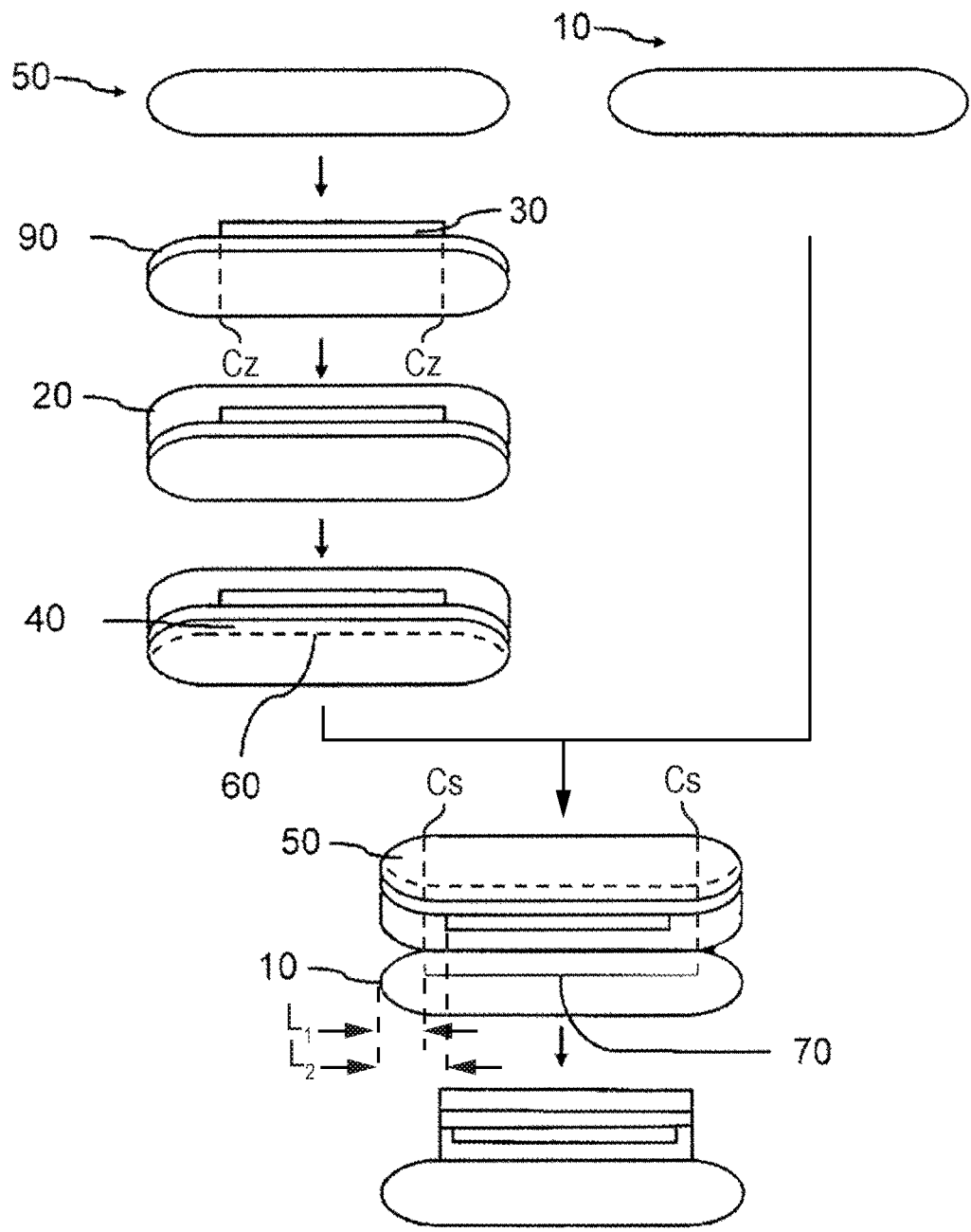
FIGS. 6A and 6B are schematic representations of a second embodiment of the disclosure.
Figure 6B:
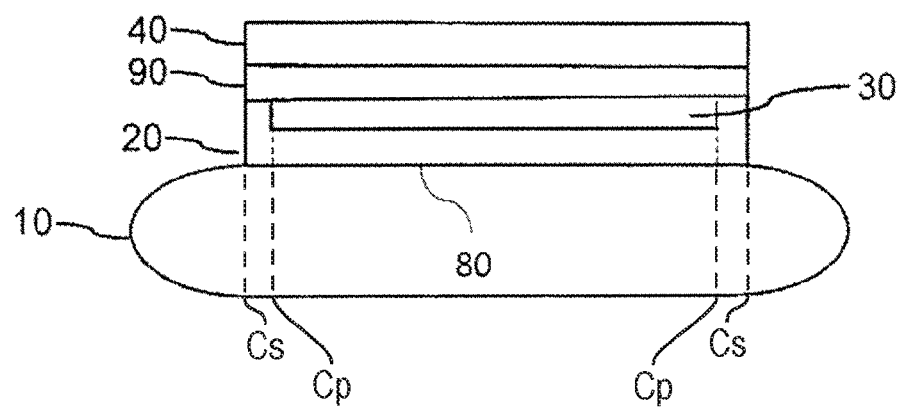

The second embodiment, illustrated in FIGS. 6A and 6B, differs from the first embodiment in that the donor substrate 50 comprises an additional layer 90, the additional layer 90 being in contact with the dielectric layer 30, the additional layer 90 having the same chemical composition as the covering layer 20.

For example, the additional layer 90 and the covering layer 20 comprise silicon oxide.

The additional layer 90 is formed directly on the donor substrate 50, before the dielectric layer 30.

The additional layer 90 may comprise a material, different from the materials of the dielectric layer 30, selected from the following materials: silicon oxide, silicon nitride or oxynitride, aluminium nitride, aluminium oxide, polycrystalline silicon and amorphous silicon.

Advantageously, the additional layer 90 is made from silicon oxide and its thickness is between 2 nm and 20 nm, for example, 7 nm.

When the donor substrate 50 is made from silicon, the additional layer 90 of silicon oxide may be obtained by thermal oxidation of this donor substrate and, therefore, form an additional layer 90 of thermal silicon dioxide.

At the end of step f), the composite structure is obtained.

The composite structure comprises, from its front face to its rear face, a useful layer 40, an additional layer 90, a dielectric layer 30, a covering layer 20 and a supporting substrate 10.

Thus, after the transfer step, the dielectric layer 30 of contour Cz is situated vertically in line with a central surface 80 of contour Cp of the supporting substrate 10.

Thus, the surface delimited by the contour Cs of the contact surface 70 and the contour Cp of the central surface 80 is opposite a stack of layers comprising only the useful layer 40, the additional layer 90 and the covering layer 20.

Moreover, the central surface 80 of the supporting substrate 10 is opposite a stack of layers comprising the useful layer 40, the dielectric layer 30 and the covering layer 20.

The covering layer 20 and the additional layer 90 having the same chemical composition, their stack is then associated with a single layer of dielectric material.

Thus, a single step is observed at the edge of the substrate.

Consequently, the observation of a single step makes it possible to encapsulate the covering layer 20, the dielectric layer 30 and the additional layer 90 with the useful layer 40. The encapsulation is executed by heat treatment, without observing any dewetting of the useful layer 40.

The additional layer 90 advantageously comprises silicon dioxide. Thus, a composite structure commonly referred to as SOI ONO (silicon-on-silicon dioxide, on silicon nitride and on silicon dioxide) is formed.

Thus, the disclosure is advantageously implemented for producing composite SOI ONO substrates or for producing SOI substrates for radio-frequency applications.

The invention claimed is:

1. A method for manufacturing a composite structure comprising, from its rear face toward its front face, a supporting substrate, a covering layer, at least one dielectric layer and a useful layer, the method comprising the following steps:
   a) providing a donor substrate and the supporting substrate;
   b) forming the dielectric layer such that the dielectric layer has a contour contained within a peripheral surface of the donor substrate, the dielectric layer comprising:
      a first surface in contact with the donor substrate,
      a second surface opposite to the first surface,
      a peripheral surface connecting the first and second surfaces together;
   c) forming the covering layer after forming the dielectric layer, the covering layer arranged so as to cover the second surface and the peripheral surface of the dielectric layer;
   d) forming a weakened zone in the donor substrate delimiting the useful layer in contact with the first surface of the dielectric layer;
   e) assembling the supporting substrate and the donor substrate such that the supporting substrate and the covering layer are in contact along a contact surface having a contour, and such that the contour of the dielectric layer fits within the contour of the contact surface; and
   f) breaking the donor substrate along the weakened zone.

2. The manufacturing method of claim 1, wherein the supporting substrate comprises:
   a top surface onto which the covering layer, the dielectric layer and the useful layer are transferred;
   a bottom surface opposite to the top surface;
   a peripheral zone connecting the bottom surface and the top surface; and
   wherein the contour of the contact surface and the peripheral zone of the supporting substrate delimit an essentially annular surface of width $L_1$, and steps b) and e) are executed such that the contour of the dielectric layer and the peripheral zone of the supporting substrate delimit an essentially annular surface with a width $L_2$ of between 105% and 150% of the width $L_1$.

3. The manufacturing method of claim 1, wherein forming the dielectric layer comprises the following steps:
   b1) forming a layer of dielectric material on the donor substrate; and
   b2) partially removing the layer of dielectric material such that the residual layer of dielectric material forms the dielectric layer and the contour of the dielectric layer is contained within the peripheral surface of the donor substrate.

4. The manufacturing method of claim 1, wherein the dielectric layer comprises silicon nitride and has a thickness of between 10 nm and 80 nm, and wherein the covering layer comprises silicon dioxide and has a thickness greater than 80 nm.

5. The manufacturing method of claim 1, wherein the dielectric layer comprises silicon oxide, and wherein the covering layer comprises polycrystalline silicon or amorphous silicon.

6. The manufacturing method of claim 1, wherein the donor substrate comprises at least one of the following materials: silicon, germanium, and silicon germanium alloy.

7. The manufacturing method of claim 1, wherein step f) is followed by a heat treatment step for encapsulating the covering layer and the dielectric layer with the useful layer.

8. The manufacturing method of claim 1, wherein the donor substrate comprises an additional layer, the additional layer being in contact with the dielectric layer, the additional layer having the same chemical composition as the covering layer.

9. The manufacturing method of claim 8, wherein the donor substrate comprises silicon, the additional layer comprises silicon dioxide, the dielectric layer comprises silicon nitride, and the covering layer comprises silicon dioxide.

10. The manufacturing method of claim 2, wherein the contour of the dielectric layer and the peripheral zone of the supporting substrate delimit an essentially annular surface with a width $L_2$ of between 110% and 140% of the width $L_1$.

11. The manufacturing method of claim 10, wherein the contour of the dielectric layer and the peripheral zone of the supporting substrate delimit an essentially annular surface with a width $L_2$ of between 115% and 130% of the width $L_1$.

12. The manufacturing method of claim 2, wherein forming at least the dielectric layer comprises the following steps:
   b1) forming a layer of dielectric material on the donor substrate; and b2) partially removing the layer of dielectric material such that the residual layer of dielectric material forms the dielectric layer and the contour of the dielectric layer is contained within the peripheral surface of the donor substrate.

* * * * *